United States Patent
Kim et al.

(10) Patent No.: US 7,132,677 B2
(45) Date of Patent: Nov. 7, 2006

(54) SUPER BRIGHT LIGHT EMITTING DIODE OF NANOROD ARRAY STRUCTURE HAVING INGAN QUANTUM WELL AND METHOD FOR MANUFACTURING THE SAME

(75) Inventors: Hwa-Mok Kim, Seoul (KR); Tae-Won Kang, Seoul (KR); Kwan-Soo Chung, Gyeonggi-Do (KR)

(73) Assignee: Dongguk University, Seoul (KR)

( * ) Notice: Subject to any disclaimer, the term of this patent is extended or adjusted under 35 U.S.C. 154(b) by 115 days.

(21) Appl. No.: 10/779,197

(22) Filed: Feb. 13, 2004

(65) Prior Publication Data

US 2005/0194598 A1  Sep. 8, 2005

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ............................ 257/14; 257/11; 257/12; 257/13; 257/23; 257/51; 257/79; 257/94; 257/97; 257/183; 257/201; 257/746; 257/E31.033; 257/E31.019; 257/E31.026; 257/E31.059; 257/E31.064; 257/E31.08; 257/E31.069; 257/31.07; 257/E31.071; 257/E31.072; 977/762; 977/763; 977/764; 977/765; 977/784; 977/815; 977/825

(58) Field of Classification Search ............ 257/13–14, 257/79, 746, 11–2, 23, 51, 94, 96, 97, 183, 257/201, E31.033, E31.019, E31.026, E31.059, 257/E31.064, E31.07, E31.071, E31.072, 257/E31.08, E31.069; 977/762–765, 784, 977/815, 825

See application file for complete search history.

(56) References Cited

U.S. PATENT DOCUMENTS

| | | | |
|---|---|---|---|
| 6,773,616 B1 * | 8/2004 | Chen et al. | 216/41 |
| 6,773,946 B1 * | 8/2004 | Moon et al. | 438/34 |
| 6,791,105 B1 * | 9/2004 | Shim et al. | 257/14 |
| 6,882,051 B1 * | 4/2005 | Majumdar et al. | 257/746 |
| 6,996,147 B1 * | 2/2006 | Majumdar et al. | 438/22 |
| 2003/0209716 A1 * | 11/2003 | Kito et al. | 257/79 |
| 2004/0109666 A1 * | 6/2004 | Kim, II | 385/147 |
| 2004/0127130 A1 * | 7/2004 | Yi et al. | 442/376 |
| 2005/0006754 A1 * | 1/2005 | Arik et al. | 257/712 |
| 2005/0082543 A1 * | 4/2005 | Alizadeh et al. | 257/79 |

OTHER PUBLICATIONS

Kim et al., *Adv. Mater.* 2002, 14, No. 13-14, Jul. 4: 991-993.
Kim et al., *Adv. Mater.* 2003, 15, No. 3, Feb. 5: 232-235.
Kim et al., *Adv. Mater.* 2003, 15, No. 7-8, Apr. 17: 567-569.

* cited by examiner

*Primary Examiner*—Zandra V. Smith
*Assistant Examiner*—Ida M. Soward
(74) *Attorney, Agent, or Firm*—Fredrikson & Byron, PA

(57) ABSTRACT

An GaN light emitting diode (LED) having a nanorod (or, nanowire) structure is disclosed. The GaN LED employs GaN nanorods in which a n-type GaN nanorod, an InGaN quantum well and a p-type GaN nanorod are subsequently formed in a longitudinal direction by inserting the InGaN quantum well into a p-n junction interface of the p-n junction GaN nanorod. In addition, a plurality of such GaN nanorods are arranged in an array so as to provide an LED having much greater brightness and higher light emission efficiency than a conventional laminated-film GaN LED.

10 Claims, 9 Drawing Sheets

SUPER BRIGHT LIGHT EMITTING DIODE OF NANOROD ARRAY STRUCTURE HAVING INGAN QUANTUM WELL AND METHOD FOR MANUFACTURING THE SAME

BACKGROUND OF THE INVENTION

1. Field of the Invention

The present invention relates to a super bright light emitting diode (LED), and more particularly to an LED having a nanorod (or, nanowire) structure and its manufacturing method.

2. Description of the Related Art

LED is generally used as a simple display element of a gauge or meter at the early state, and recently noticed as a full-color display element having super brightness, high contrast and long life cycle owing to the development of blue and green super brightness LED. On the other hand, as a material of such an LED, a III-nitrogen compound semiconductor using such as GaN is recently researched abundantly since III–V group nitride semiconductors have so wide a bandgap to give a light in the almost all wavelengths from visible rays to ultraviolet rays according to composition of nitride. However, GaN currently uses a sapphire substrate since there is no lattice-matched substrate at present, so there is still much mismatching and coefficient of thermal expansion is still great.

Thus, there is proposed a conventional laminated-film LED in which a n-GaN layer to which n-type impurities are added, an InGaN activate layer, and a p-GaN layer to which p-type impurities are added are subsequently laminated on a sapphire substrate. However, the laminated-film LED has a limit in the element performance (or, brightness) since many threading dislocations exist due to the lattice mismatching, caused by the aforementioned properties and growth manners of GaN. In addition, the conventional laminated-film GaN LED suffers from some limitations such as the poor extraction efficiency of light, the wide spectral width, and the large divergence of the output as well as the aforementioned threading dislocations, in spite of many advantages of being relatively simple to design and manufacture and having low temperature sensitivity.

On the other hand, in order to overcome the disadvantages of the laminated-film LED, a nano-scale LED which forms an LED by making a p-n junction with the use of one-dimensional rod or linear nanorod (or, nanowire), or a micro-scale LED using micro-ring or micro-disc is studied. However, there is unfortunately found that many threading dislocations are generated in such a nano-scale or micro-scale LED similar to the laminated-film LED, so an LED having super brightness to a satisfactory level is not still appeared. In addition, the nanorod LED is a simple p-n junction diode, not giving super brightness. Moreover, the micro-ring or micro-disc LED is currently manufactured using photolithography or electron-beam lithography which is apt to damage the lattice structure of GaN during the lithography process, so brightness and light emission efficiency of the LED are not satisfactory.

SUMMARY OF THE INVENTION

The present invention is designed to solve the problems of the prior art, and therefore it is an object of the present invention to provide a GaN LED structure having super brightness and high light emission efficiency on the consideration of such demands.

In addition, an object of the invention is to provide a method for reproducibly manufacturing the GaN LED having super brightness and high light emission efficiency.

In order to accomplish the above object, the GaN LED of the present invention employs GaN nanorods in which a n-type GaN nanorod, an InGaN quantum well and a p-type GaN nanorod are subsequently formed in a longitudinal direction by inserting the InGaN quantum well into a p-n junction interface of the p-n junction GaN nanorod. In addition, a plurality of such GaN nanorods are arranged in an array so as to provide an LED having much greater brightness and higher light emission efficiency than a conventional laminated-film GaN LED.

In other words, the LED includes a substrate; a nanorod array composed of a plurality of nanorods including a first-conductive type GaN nanorod perpendicular to the substrate, an InGaN quantum well formed on the first-conductive type GaN nanorod, and a second-conductive type GaN nanorod formed on the InGaN quantum well; an electrode pad commonly connected to the first-conductive type GaN nanorod of the nanorod array for applying voltage thereto; and a transparent electrode commonly connected upon the second-conductive type GaN nanorod of the nanorod array for applying voltage thereto. Here, the terms 'first-conductive type' and 'second-conductive type' respectively mean n-type and p-type, or vice versa.

Preferably, a transparent insulating material having good gap filling characteristics such as SOG (Spin-On-Glass), $SiO_2$ or an epoxy resin is filled among the plurality of nanorods.

In addition, the quantum well is preferably a multi quantum well in which a plurality of InGaN layers and a plurality of GaN barriers are laminated in turns.

According to another aspect of the invention, there is also provided a method for manufacturing an LED, which includes: forming a plurality of first-conductive type GaN nanorods in an array perpendicular to a substrate; forming an InGaN quantum well on each first-conductive type GaN nanorod; forming a second-conductive type GaN nanorod on each InGaN quantum well; forming an electrode pad for applying voltage to the first-conductive type GaN nanorods; and forming a transparent electrode to be commonly connected to the second-conductive type GaN nanorods for supplying voltage thereto. Here, the first-conductive type GaN nanorods, the InGaN quantum wells and the second-conductive type GaN nanorods are preferably formed in-situ using MO-HVPE (metalorganic-hydride vapor phase epitaxy).

According to the present invention, it is possible to obtain an LED having great-brightness and high light emission efficiency at a good yield without any catalyst or template.

BRIEF DESCRIPTION OF THE DRAWINGS

Other objects and aspects of the present invention will become apparent from the following description of embodiments with reference to the accompanying drawing in which:

FIG. 1b is a plane view showing the LED of FIG. 1a;

FIG. 2 is a sectional view showing a multi quantum well of the LED of FIG. 1a;

FIG. 5b is a graph showing a peak wavelength at each current in the graph of FIG. 5a;

DESCRIPTION OF THE PREFERRED EMBODIMENT

Hereinafter, preferred embodiments of the present invention will be described in detail referring to the accompanying drawings. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1A:
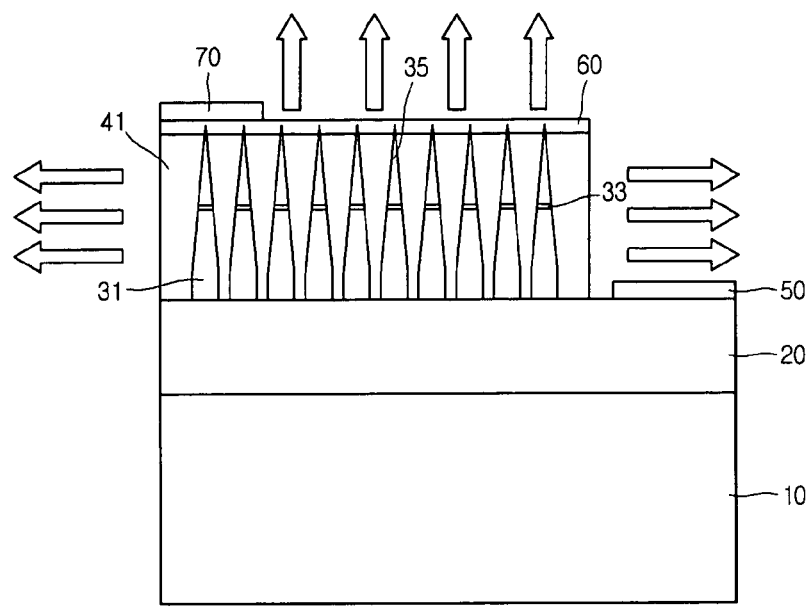
FIG. 1a is a schematic view showing a section of an LED according to a preferred embodiment of the present invention.
Figure 1B:
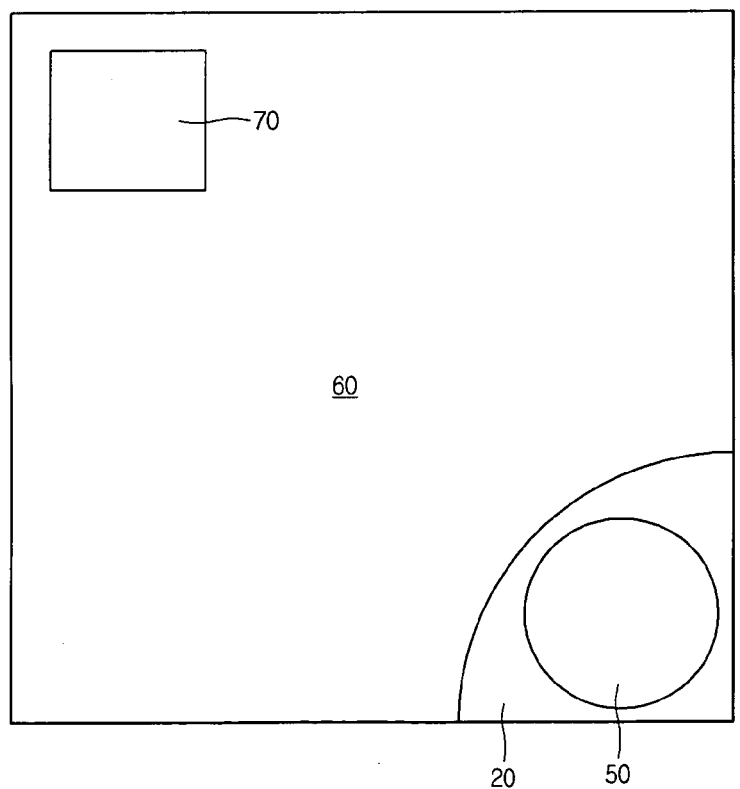

FIG. 1a is a schematic view showing a section of a light emitting diode (LED) according to a preferred embodiment of the present invention, and FIG. 1b is a plane view showing the LED of FIG. 1a.

To describe a structure of the LED according to this embodiment with reference to FIGS. 1a and 1b, the LED includes a sapphire substrate 10 on which a n-type GaN buffer layer 20, a plurality of GaN nanorods 31, 33 and 35 arranged in an array, a transparent insulating material 41 filled among the GaN nanorods, a transparent electrode 60, and electrode pads 50 and 70 are formed.

The n-type GaN buffer layer 20 formed on the substrate 10 buffs lattice constant mismatch of the substrate 10 and the n-type GaN nanorod 31, and plays a role of applying voltage to the n-type GaN nanorods 31 in common through the electrode pad 50.

The plurality of GaN nanorods 31, 33 and 35 arranged on the n-type GaN buffer layer 20 in an array includes a n-type GaN nanorod 31, an InGaN quantum well 33 and a p-type GaN nanorod 35, respectively. These GaN nanorods substantially have homogeneous height and diameter distributions and are formed perpendicular to the n-type GaN buffer layer 20.

Figure 2:
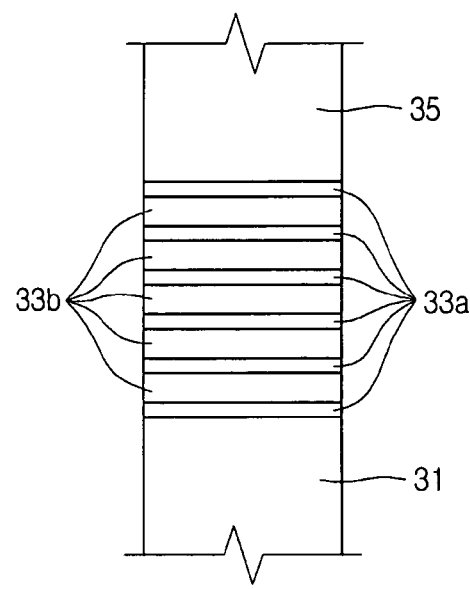

Here, the InGaN quantum well 33 is an active layer for giving a visible ray having super brightness, compared with a simple p-n junction diode. In this embodiment, the InGaN quantum well 33 has a multi quantum well structure in which a plurality of InGaN layers 33a and a plurality of GaN barrier layers 33b are laminated in turns as shown in FIG. 2. In particular, interfaces between the InGaN layers 33a and the GaN barrier layers 33b of the multi quantum well 33 of this embodiment are very clean and substantially dislocation-free, as described later.

The transparent insulating material 41 is filled among the plurality of GaN nanorods 31, 33 and 35 so as to insulate each nanorod and protect the nanorods from external impacts which are likely exerted to the nanorods. In addition, the transparent insulating material 41 acts as an underlying layer for connecting the transparent electrode 60 to each nanorod in common. A material of the transparent insulating layer 41 is not specially limited, but a transparent SOG (Spin-On-Glass), $SiO_2$ or epoxy resin which may easily fills gaps among the nanorods, endure heat in a following annealing process or the like and not disturb lateral lights of the nanorods (see right and left arrows in FIG. 1a) is preferably used. In addition, the transparent insulating material 41 is preferably formed slightly lower than the height of the p-type GaN nanorods 35 so that top ends of the p-type GaN nanorods 35 can be connected to the transparent electrode 60 in common.

The transparent electrode 60 is made of a transparent conductive material so that the transparent electrode 60 may be in ohmic contact with the p-type GaN nanorod 35 for supplying voltage thereto in common and not disturb longitudinal light of the nanorods (see upward arrows in FIG. 1a). The transparent electrode 60 preferably employs a Ni/Au film, though not specially limited.

The electrode pad 70 is formed on a predetermined region of the transparent electrode 60 as a terminal for applying voltage to the transparent electrode (resultantly to the p-type GaN nanorods). This electrode pad 70 is made of a Ni/Au layer to which a wire (not shown) is bonded, though not specially limited. In addition, the electrode pad 50 is formed on the n-type GaN buffer layer 20 in ohmic contact with the n-type GaN buffer layer in order to apply voltage to the n-type GaN nanorods through the n-type GaN buffer layer 20. This electrode pad 50 is made of a Ti/Al layer to which a wire (not shown) is also bonded, though not specially limited.

If a direct voltage is applied to both electrode pads 50 and 70 of the LED according to this embodiment (+ voltage is applied to the electrode pad 70, and − voltage or ground potential is applied to the electrode pad 50), lights having super brightness are emitted laterally and longitudinally from the nanorods, each of which may be called a nano LED, as shown in FIG. 1a.

In particular, since the InGaN quantum well is formed in each nanorod in this embodiment, it is possible to emit a light higher brightness than a simple p-n junction diode. In addition, the plurality of nano LEDs greatly increase a light emission area (particularly, a lateral light emission area), so the light emission efficiency is much more increased rather than the conventional laminated-film LED.

Meanwhile, a wavelength of the light emitted from the LED of this embodiment may be controlled by adjusting an amount of In in the InGaN quantum well or adjusting a thickness of the quantum well 33. Furthermore, a white light may also be obtained as follows.

At first, as a content of In is increased in InGaN, a bandgap is decreased and a wavelength of an emitted light is elongated. Using this phenomenon, it is possible to obtain a light ranged from an ultraviolet ray to the entire visible ray such as blue, green and red. In addition, the wavelength of an emitted light may also be changed by adjusting a thickness of the quantum well, or the InGaN layer 33. In other words, if a thickness of the InGaN layer is increased, the bandgap is decreased, so a light more approximate to red may be obtained.

Furthermore, since the LED of this embodiment has a multi quantum well structure as mentioned above, the LED may give a white light using such a structure. In other words, if the plurality of InGaN layers 33a of the multi quantum well are divided into several groups, and a content of In in the InGaN layer is differently adjusted for each group, for example for a blue light emitting group, a green light emitting group and a red light emitting group, a white light may be obtained as a whole. In addition, a white light may also be obtained using a fluorescent material. In particular, this embodiment may manufacture a white light emitting diode in a simple way by adding a fluorescent material to the transparent insulating layer 41 for giving a white light. For example, if the nanorods 30 configures the quantum well to emit a blue light and a yellow fluorescent material is added to the transparent insulating material 41, a white light may be emitted as a whole.

Though the LED of this embodiment is configured as described above, detailed structure and material may be variously modified. For example, though it is described above that the n-type GaN layer is firstly formed and then the p-type GaN nanorod is formed thereon, the order of n-type and p-type may be alternated. In addition, position and shape of the electrode pads 50 and 70 may also be changed differently if the electrode pads 50 and 70 can apply voltage to the n-type GaN nanorods 31 and the p-type GaN nanorods 35 in common, not limited to the position and shape shown in FIGS. 1a and 1b.

In addition, though a sapphire is used for the substrate 10 in the above description, a silicon substrate may also be used. The silicon may be made into a conductor by adding appropriate impurities (n-type impurities in the above case), differently to the sapphire which is a nonconductor. Thus, the n-type GaN buffer layer 20 is not necessary, and the electrode pad 50 may also be formed on a lower surface of the silicon substrate (i.e., a surface opposite to the surface on which the nanorods 30 are formed), not formed on a part of the n-type GaN buffer layer 20.

Now, a method for manufacturing the GaN LED according to this embodiment is described.

First, a process of growing GaN by the epitaxial growth is described. In order to grow an epitaxial layer, there is generally used VPE (Vapor Phase Epitaxial) growth, LPE (Liquid Phase Epitaxial) growth and SPE (Solid Phase Epitaxial) growth. Here, VPE grows a crystal on a substrate through thermal resolution and reaction with flowing a reaction gas on the substrate. VPE may be classified into hydride VPE (HVPE), halide VPE (HVPE) and metal organic VPE (MOVPE) according to a kind of the reaction gas.

Though it is described that the GaN layer and the InGaN/GaN quantum well are formed using the metal organic hydride VPE (MO-HVPE), the present invention is not limited to that case, but the GaN layer and the InGaN/GaN quantum well may be formed using another appropriate growth method.

GaCl, trimethylindium (TMIn) and $NH_3$ are respectively used as Ga, In and N precursors. GaCl may be obtained by reacting metal gallium (Ga) and HCl at 600 to 950° C. In addition, impurity elements doped for growing the n-type GaN and the p-type GaN are respectively Si and Mg, which are respectively supplied by means of $SiH_4$ and $Cp_2Mg$ (Bis(cyclopentadiencyl)magnesium).

Now, a method for manufacturing the GaN LED of this embodiment is described in detail.

Figure 3A:
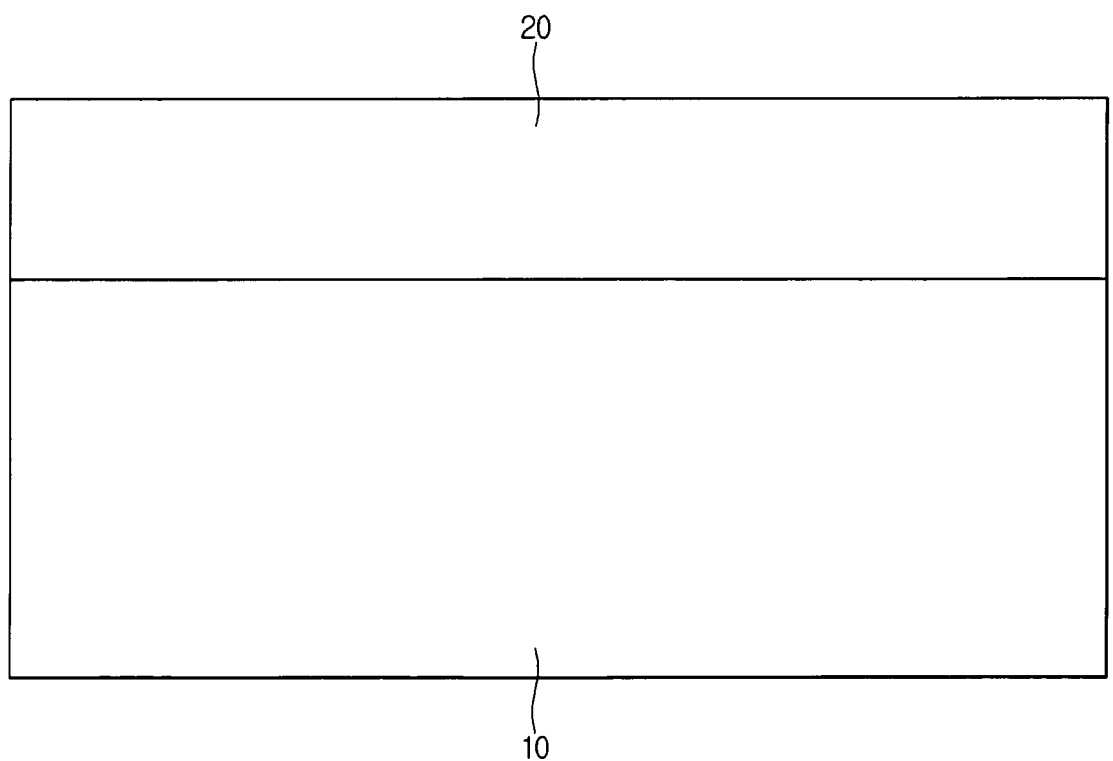
FIGS. 3a to 3d are sectional views for illustrating the process of manufacturing an LED according to a preferred embodiment of the present invention.

First, as shown in FIG. 3a, the substrate 10 made of a sapphire wafer is put into a reactor (not shown), and then the n-type GaN buffer layer 20 is formed on the substrate 10. At this time, the n-type GaN buffer layer 20 may be formed by doping Si as mentioned above. However, using the property that GaN grown without intentional doping basically has a n-type feature due to nitrogen vacancy or oxygen impurities, it is possible to grow a n-type GaN buffer layer 20 having a thickness of approximately 1.5 μm by supplying Ga and N precursors at a flow rate of 30 to 70 sccm and 1000 to 2000 sccm respectively for 50 to 60 minutes at a temperature of 400 to 500° C. and at an atmosphere or slightly positive pressure without any intentional doping.

Figure 3B:
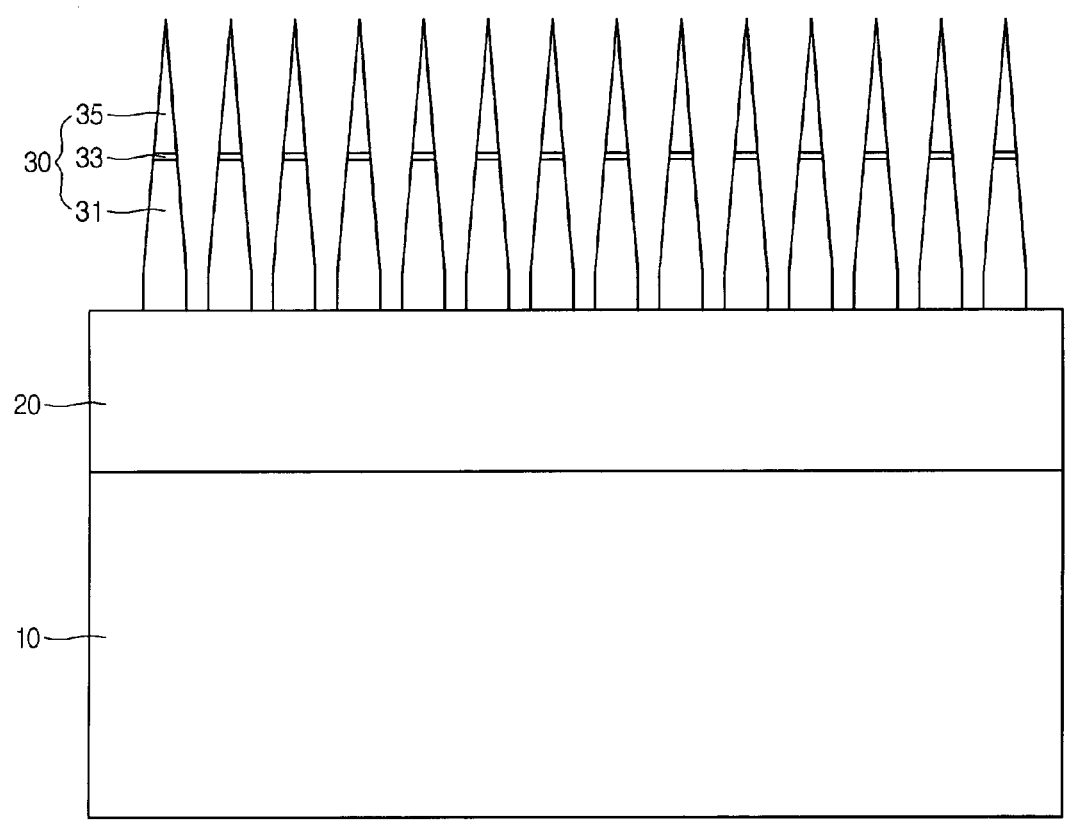

Subsequently, as shown in FIG. 3b, a nanorod array composed of a plurality of nanorods 30 is formed. This process is preferably executed in-situ successively in the reactor in which the n-type GaN buffer layer 20 was grown in the above process. Specifically, the n-type GaN nanorod 31 is firstly grown. At this time, a n-type GaN nanorod 31 having a height of approximately 0.5 μm may be grown perpendicular to the n-type GaN buffer layer 20 by supplying Ga and N precursors into the reaction at a flow rate of 30 to 70 sccm and 1000 to 2000 sccm respectively for 20 to 40 minutes at a temperature of 400 to 600° C. and at an atmosphere or slightly positive pressure and at the same time supplying $SiH_4$ at a flow rate of 5 to 20 sccm.

On the other hand, if GaN is grown at a high temperature (e.g., 1000° C. or above), seeds of GaN initially formed are abruptly grown not only in an upward direction but also in lateral directions, so GaN is grown in a shape of film, not a nanorod shape. At this time, dislocations are inevitably generated in the seeds and at a border at which the seeds meet each other due to the lateral growth, and these dislocations are propagated to a thickness direction together with the growth of the film, thereby generating the threading dislocations. However, if the process conditions are kept as mentioned in this embodiment, the seeds are mainly grown upward without any catalyst or template layer, so it is possible to grow a plurality of n-type GaN nanorods having substantially homogeneous height and diameter distributions.

Then, the InGaN quantum well 33 is grown on the n-type GaN nanorod 31. This process is also preferably conducted in-situ successively in the reaction in which the n-type GaN nanorod 31 was grown. Specifically, Ga, In and N precursors are supplied into the reaction at a flow rate of 30 to 70 sccm, 10 to 40 sccm and 1000 to 2000 sccm respectively at a temperature of 400 to 500° C. and at an atmosphere or slightly positive pressure. Then, the InGaN quantum well 33 is formed on each n-type GaN nanorod 31. At this time, the time for growing the InGaN quantum well 33 is suitably selected until the InGaN quantum well 33 has a desired thickness. The thickness of the quantum well 33 is a factor of determining a light wavelength emitted from the completed LED as mentioned above. Thus, it is required to set a thickness of the quantum well 33 appropriate to the light having a required wavelength, and the growth time is also determined according to the thickness. In addition, since the wavelength of emitted light also varies depending on an amount of In, a supplied amount of each precursor is also controlled according to a desired wavelength.

Furthermore, the InGaN quantum well 33 may take a multi quantum well structure in which a plurality of InGaN layers 33a and a plurality of GaN barrier layers 33b are laminated in turns as shown in FIG. 2. This multi quantum well structure may be obtained by repeating supply and interception of the In precursor periodically for a predetermined time respectively.

Subsequently, the p-type GaN nanorod 35 is grown on the InGaN quantum well 33. This process is also performed in-situ successively in the reactor in which the InGaN quantum well 33 was grown. Specifically, a p-type GaN nanorod 35 having a height of approximately 0.4 μm may be grown perpendicular to the substrate 10 by supplying Ga and N precursors into the reactor at a flow rate of 30 to 70 sccm and 1000 to 2000 sccm respectively for 20 to 40 minutes at a temperature of 400 to 600° C. and at an atmosphere or slightly positive pressure and at the same time supplying $Cp_2Mg$ at a flow rate of 5 to 20 sccm.

Figure 4:
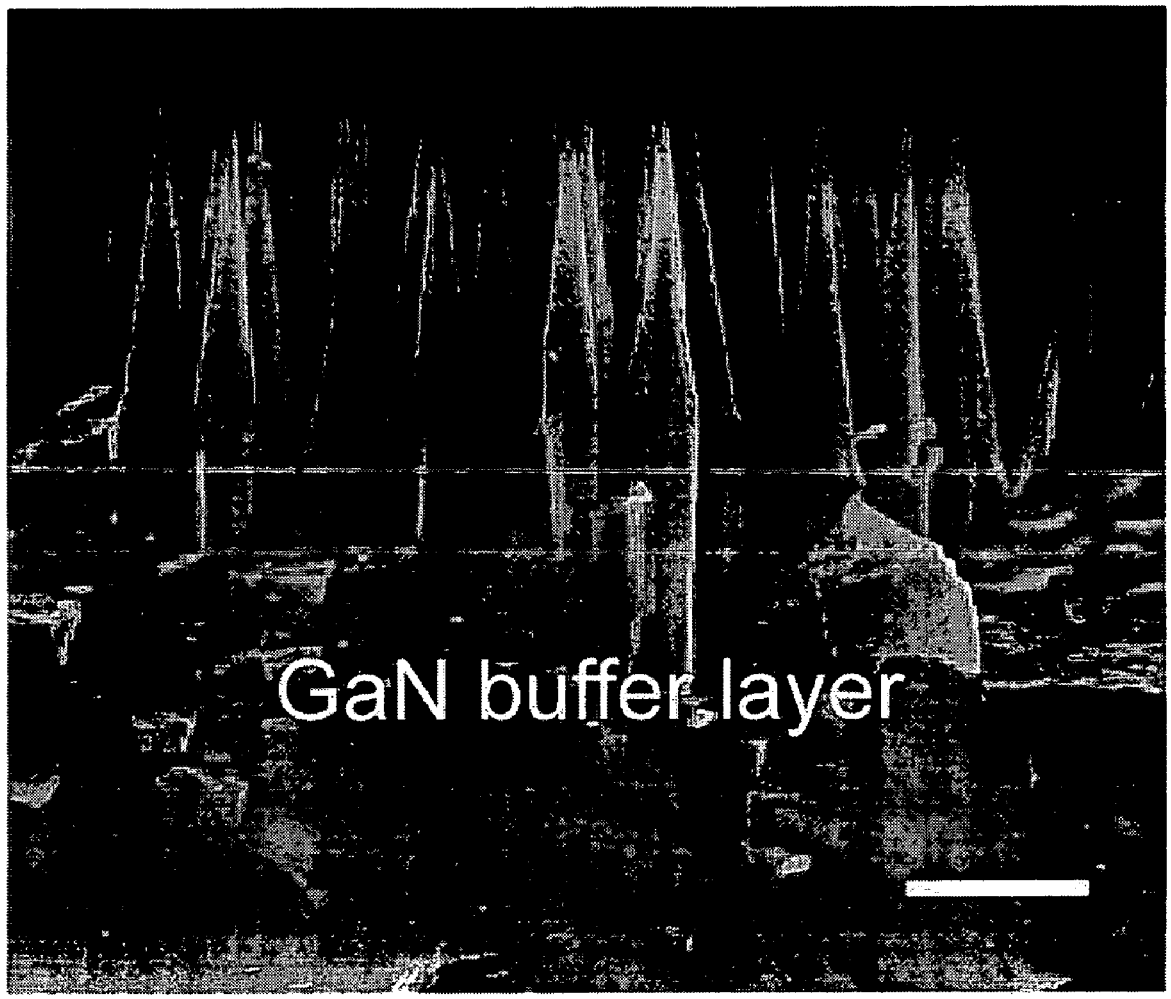
FIG. 4 is a photograph taken by SEM (Scanning Electron Microscope) for showing a nanorod array manufactured according to an embodiment of the present invention.

FIG. 4 is a photograph showing an array of the nanorods 30 grown according to the above processes, taken by a scanning electron microscope (SEM). As well known from FIG. 4, the nanorods 30 including the InGaN quantum well grown according to this embodiment have substantially homogeneous height and diameter distributions with a significantly high density. Mean diameters of the nanorods 30 grown according to the aforementioned processes are in the range of 70 to 90 nm at a portion where the quantum well 33 is formed, and an average gap (i.e., an average gap distance) among the nanorods 30 is approximately 100 nm.

Figure 3C:
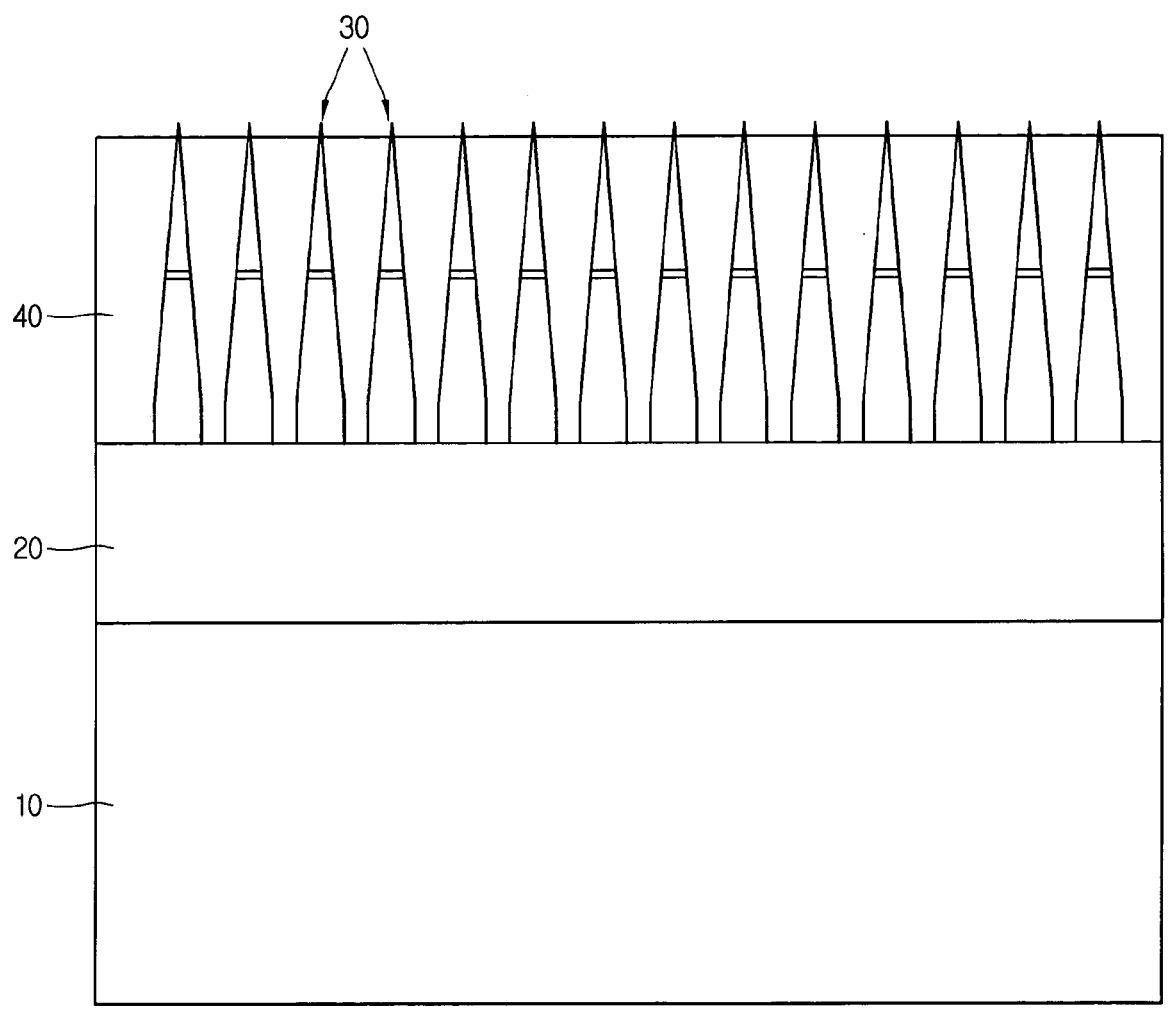

After the array of nanorods 30 is formed, as shown in FIG. 3c, the gaps among the nanorods 30 are filled with a transparent insulating material 40. At this time, SOG, $SiO_2$ or an epoxy resin is suitable for the transparent insulating material as mentioned above. If SOG or an epoxy resin is used for the transparent insulating material, the spin-coating and curing processes are executed to give a structure as shown in FIG. 3c. At this time, if the gap is filled with the transparent insulating material, the gaps among the nanorods 30 preferably have a width of 80 nm or above so that the gaps are fully filled. Meanwhile, the thickness of the filled transparent insulating material 40 is preferably slightly lower than the height of the nanorods 30.

Figure 3D:
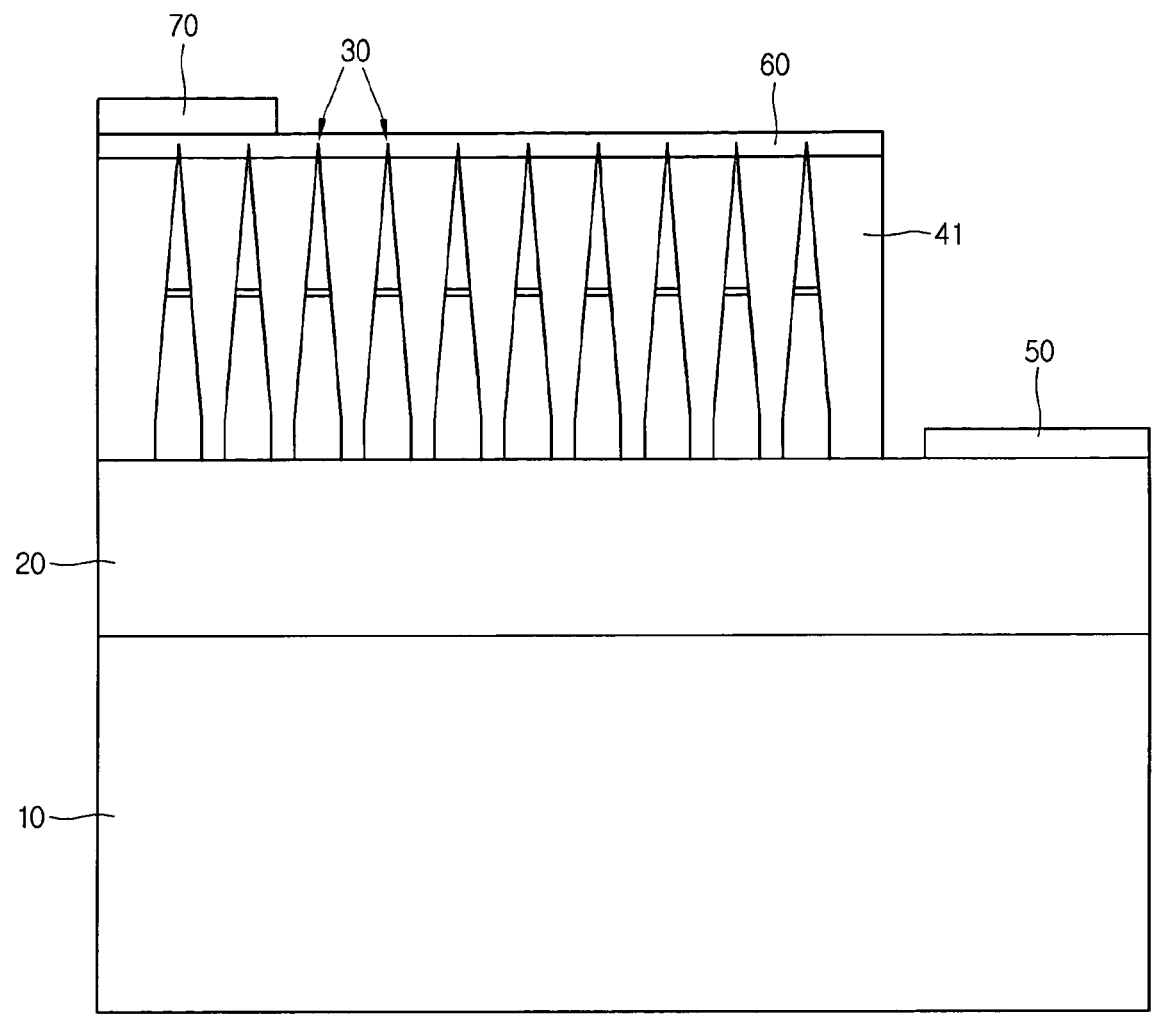

Subsequently, as shown in FIG. 3d, the electrode pads 50 and 70 and the transparent electrode 60 are formed for applying voltage, and then the GaN LED of a nanorod array structure having the InGaN quantum well is completed. Specifically, in order to form the electrode pad 50 for applying voltage to the n-type GaN nanorods 31 in the state of FIG. 3c, the transparent insulating material 40 and the nanorods 30 are partially removed so that the n-type GaN buffer layer 20 is partially exposed. Then, the electrode pad 50 is formed using the lift-off process on a region where the n-type GaN buffer layer 20 is partially exposed. This electrode pad 50 may be formed using, for example, the electron-beam evaporation of a Ti/Al layer. And then, the transparent electrode 60 and the electrode pad 70, which are made of a Ni/Au layer as an example, are formed in a similar way.

On the other hand, the transparent electrode 60 is naturally contacted with the nanorods 30 slightly exposed over the transparent insulating material 41, resulting in electric connection to the n-type GaN nanorods 35. In addition, the transparent electrode 60 is preferably so thin not to interrupt the light emitted from the respective nano LED positioned below, while the electrode pads 50 and 70 preferably have so sufficient thickness that an external contact terminal such as a wire may be connected in a way of bonding or the like.

As described above, the method for manufacturing the GaN LED according to this embodiment makes it possible to uniformly grow nanorods, which are subsequently composed of the n-type GaN nanorod 31, the InGaN quantum well 33 and the p-type GaN nanorod 35, in an array.

On the other hand, unessential features of this embodiment may be changed as desired. For example, the sequence and manner for forming the electrode pads 50 and 70 and the transparent electrode 60 may be variously changed into other known ways (e.g., deposition, photolithography and so on). In particular, each material of the aforementioned embodiment may be substituted with other well-known equivalent materials, and each process condition may be changed out of the exemplified range depending on the kind of reactor and used material.

In addition, though a sapphire wafer is used for the substrate 10 in the above case, a silicon wafer (preferably, a silicon wafer doped with n-type impurities such as phosphorus) may also be used. In this case, as mentioned above, the n-type GaN buffer layer 20 is not necessary, and the electrode pad 50 may also be formed on the lower surface of the silicon substrate, not a partial region upon the GaN buffer layer 20. In other words, the electrode pad is firstly formed on one side of the silicon wafer, and then the nanorods 30 are formed directly on the opposite surface.

Now, the GaN LED of this embodiment is manufactured as follows and then its light emission characteristics are studied, as described below. But, specific numbers and methods suggested below are just one example, and they are not intended to limit the scope of the invention.

At first, a sapphire (0001) wafer is prepared as the substrate 10, and then the n-type GaN buffer layer 20 and the GaN nanorods 30 are grown with the precursors by the aforementioned MO-HVPE. Here, among the nanorods 30, the InGaN quantum well 33 has a composition ratio of $In_xGa_{1-x}N$ to become $In_{0.25}Ga_{0.75}N$ so that a light emission wavelength of the completed LED is less than 470 nm. In addition, the quantum well is a multi quantum well repeating InGaN/GaN 6 cycles, and specific process conditions and results are shown in the following table 1.

TABLE 1

|  | n-type buffer layer (20) | n-type GaN nanorod (31) | InGaN layer (33a) | GaN barrier layer (33b) | p-type GaN nanorod (35) |
| --- | --- | --- | --- | --- | --- |
| substrate temperature | 550° C. | 460° C. | 460° C. | 460° C. | 460° C. |
| pressure | about 1 atm | about 1 atm | about 1 atm | about 1 atm | about 1 atm |
| growth time | 50 minutes | 20 minutes | 10 seconds | 25 seconds | 20 minutes |
| gas flow rate of precursor or | Ga: 50 N: 2000 | Ga: 50 N: 2000 | Ga: 50 N: 2000 | Ga: 50 N: 2000 | Ga: 50 N: 2000 |

TABLE 1-continued

|  | n-type buffer layer (20) | n-type GaN nanorod (31) | InGaN layer (33a) | GaN barrier layer (33b) | p-type GaN nanorod (35) |
|---|---|---|---|---|---|
| dopant |  | Si: 5 | In: 10 |  | Mg: 10 |
| thickness (height) | 1.5 μm | 0.5 μm | 4.8 nm | 12 nm | 0.5 μm |

Using the above process, a multi quantum well nanorod array having an area of 33 mm² is obtained. This nanorod array has a density so that about 8×10⁷ nanorods 30 exists in an area of 1 mm², and the nanorods 30 has an average diameter of approximately 70 nm at a region of the quantum well layer, and a height of approximately 1 μm. In the n-type and p-type GaN nanorods 31 and 35, a carrier concentration is respectively 1×10¹⁸ cm⁻³ and 5×10¹⁷ cm⁻³, and a composition ratio of the InGaN quantum well is $In_{0.25}Ga_{0.75}N$.

Then, SOG (ACCUGLASS T-12B™ manufactured by Honeywell Electronic Materials) is spin-coated for 30 seconds at a rotational speed of 3000 rpm and then cured by 260° C., 90 second annealing in the air so that the gaps among the nanorods 30 having a high aspect ratio are uniformly filled without void. On the other hand, the spin-coating and curing processes are executed two times in this embodiment so that SOG is fully filled in the gaps. After that, the transparent insulating material 40 having a thickness of about 0.8 to 0.9 μm is formed by 440° C., 20 minute annealing in a nitrogen-atmosphere furnace.

After that, a Ti/Al electrode pad 50 having a thickness of 20/200 nm is formed on the n-type GaN buffer layer 20 which is partially exposed, by a lift-off method and an electronic beam evaporation using photolithography and dry-etching, and then a Ni/Au transparent electrode 60 having a thickness of 20/40 nm is deposited so as to be in ohmic contact with the nano-scale LED 30. And then, a Ni/Au electrode pad 70 having a thickness of 20/200 nm is finally formed in a similar way of the electrode pad 50.

On the other hand, as a comparative example, a laminated-film GaN LED having the same size is manufactured. The LED of the comparative example has the same layer thickness and configuration as the above embodiment, but it does not employ a nanorod.

Figure 5A:
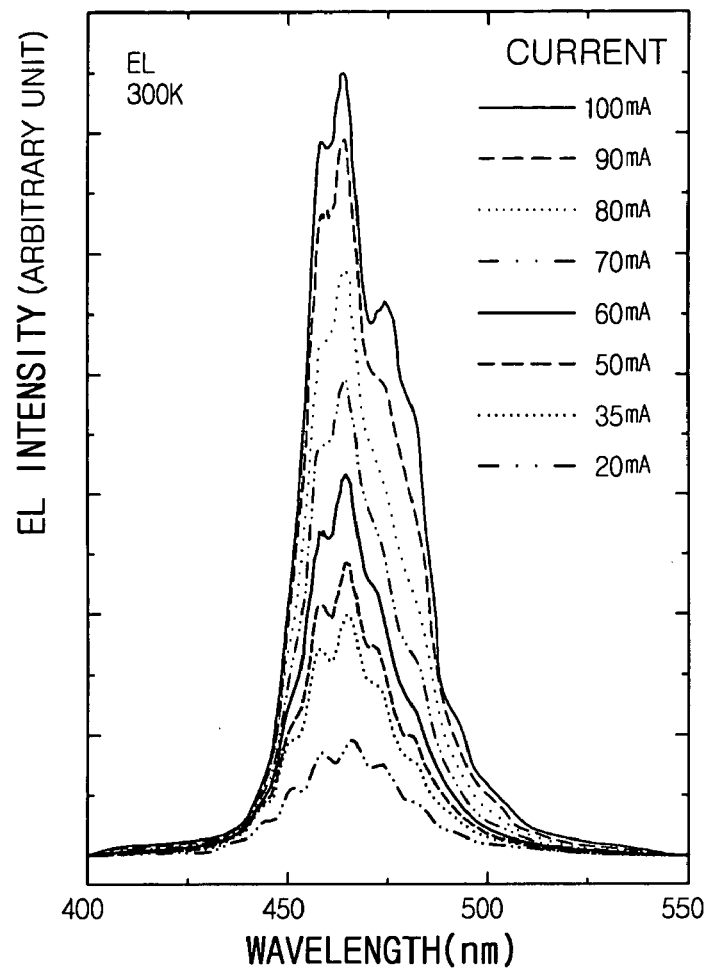
FIG. 5a is a graph showing EL (electroluminescence) intensity of a light emission wavelength at each current in an LED manufactured according to an embodiment of the present invention.
Figure 5B:
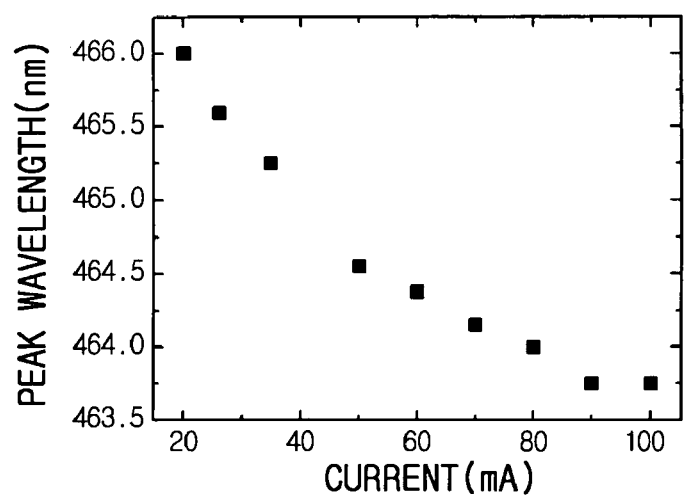

FIG. 5a is a graph showing the EL (electroluminescence) spectrum of the LED according to the embodiment of the present invention when a direct current of 20 to 100 mA is applied thereto. As well known in FIG. 5a, the LED of this embodiment is a blue light emitting diode having a wavelength of approximately 465 nm. In addition, as seen in FIG. 5b, the LED of this embodiment shows a blue-shift phenomenon that a peak wavelength is decreased as a current supply is increased. It is probably caused by a screen effect of the built-in internal polarization field in the quantum well due to the injected carrier.

Figure 6:
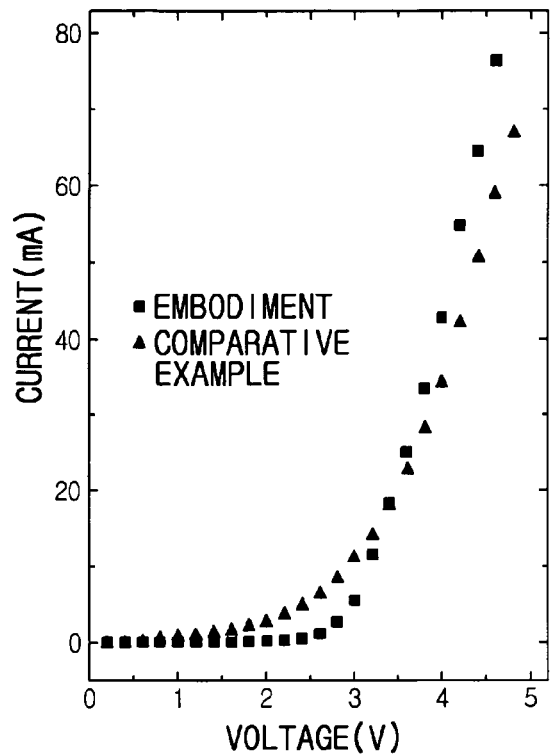
FIG. 6 is a graph showing I–V characteristics of a conventional LED and the LED according to an embodiment of the present invention.

FIG. 6 is a graph showing I–V characteristics at a room temperature possessed by the LED of this embodiment and the LED of the comparative example. As seen from FIG. 6, it is found that a turn-on voltage of the LED of the present embodiment is slightly higher than that of the comparative example. It is probably caused by the facts that an effective contact area of the embodiment is significantly smaller than that of comparative example (the LED of this embodiment may be considered as aggregation of multiple nano LEDs, and a contact area of each nano LED with the electrode 60 is much smaller than that of the comparative example), so a resistance is larger accordingly.

Figure 7:
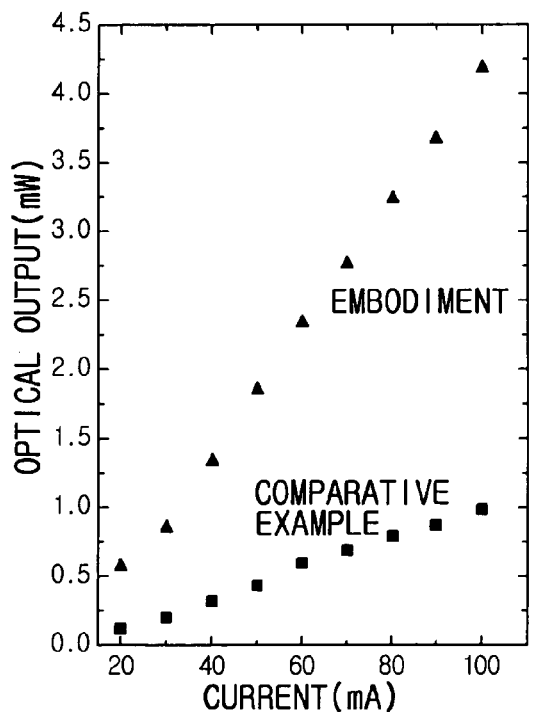
FIG. 7 is a graph showing output/forward current relation of a conventional LED and the LED according to an embodiment of the present invention.

FIG. 7 is a graph showing an optical output for a forward current, and it would be noted from FIG. 7 that an optical output of the LED of this embodiment is significantly increased rather than the comparative example (4.3 times at 20 mA when a detect area of the optical detector is 1 mm², and an optical output actually felt by a user will be more increased). This is because the lateral light emission may more effectively used by forming the nanorod array as mentioned above, rather than the conventional laminated-film LED having the same size. In addition, it is also found from the temperature-dependent PL (Photoluminescence) experiment that the LED of this embodiment has much more quantum efficiency.

Figure 8:
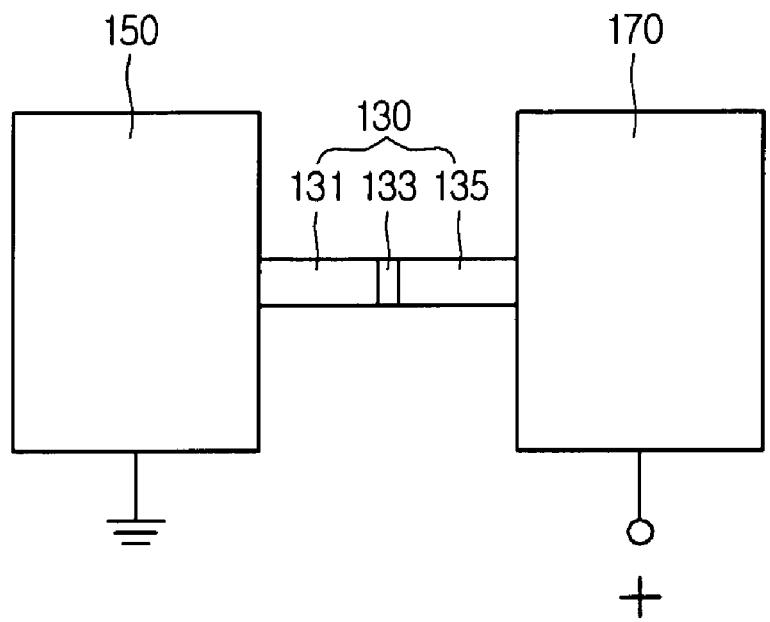
FIG. 8 is a schematic view showing an LED constructed with one InGaN quantum well nanorod according to another embodiment of the present invention.
Figure 9:
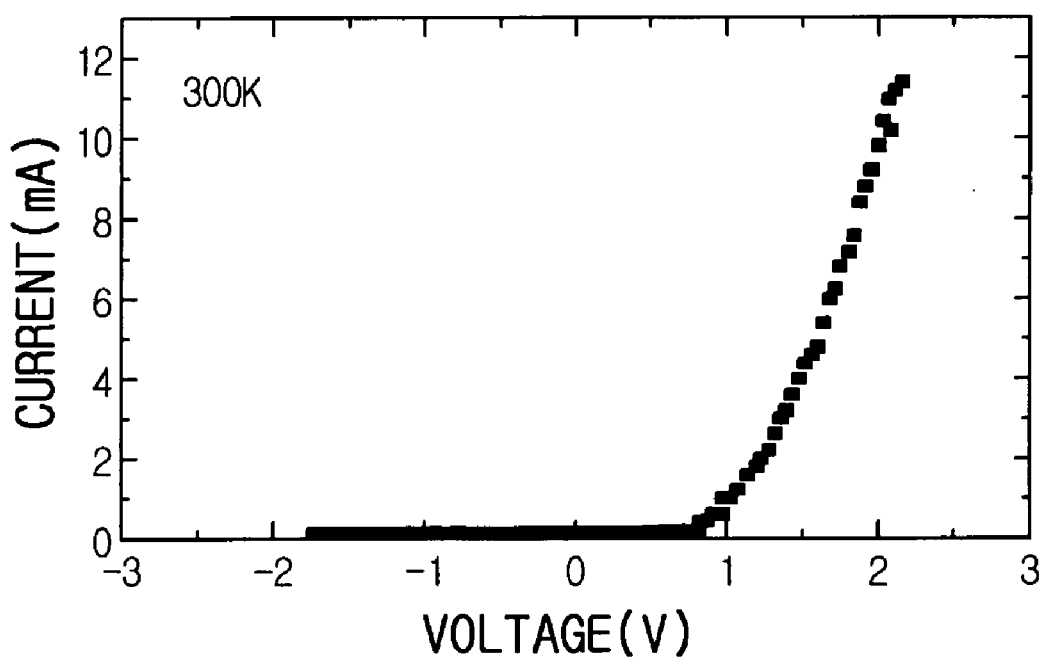
FIG. 9 is a graph showing I–V characteristics of the LED of FIG. 8.

On the other hand, FIG. 8 shows a nano LED in which an electrode is mounted to one InGaN quantum well nanorod according to another embodiment of the present invention, and FIG. 9 is a graph showing I–V characteristics of the nano LED. The nano LED shown in FIG. 8 may be obtained by dispersing nanorod arrays manufactured as above into methanol, attaching the dispersed nanorod array on a substrate such as an oxidized silicon substrate, and then forming the Ti/Al electrode pad 150 toward the n-type GaN nanorod 131 and forming the Ni/Au electrode pad 170 toward the p-type GaN nanorod 135. As known from FIG. 9 which shows I–V characteristics of the nano LED having only one nanorod obtained as above, this nano LED shows very clean and accurate rectifying features. It is probably because the p- and n-type nanorods and the quantum well were formed using the single epitaxial growth.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

According to the present invention, it is possible to obtain a great-brightness and high-quality diode with using the conventional growth method as it is since the GaN nanorod having an InGaN quantum well is formed by a single epitaxial growth.

In particular, since the LED is manufactured by forming nanorods having InGaN quantum wells in a plurality of arrays, the present invention may utilize lateral light emission as it is, thereby greatly increasing light emission efficiency. So, it is possible to obtain an LED having a much higher brightness than the conventional LED.

In addition, the present invention allows to easily obtain an LED outputting visible rays of various wavelengths or a white light by controlling a thickness of the InGaN quantum well, a content of In, or usage of fluorescent material.

What is claimed is:

1. A light emitting diode (LED) comprising:
a substrate;
a nanorod array composed of a plurality of nanorods including a first-conductive type GaN nanorod perpendicular to the substrate, an InGaN quantum well formed on the first-conductive type GaN nanorod, the quantum well being a multi quantum well in which a plurality of InGaN layers and a plurality of GaN barriers are laminated in turns, and a second-conductive type GaN nanorod formed on the InGaN quantum well;
an electrode pad commonly connected to the first-conductive type GaN nanorod of the nanorod array for applying voltage thereto; and
a transparent electrode commonly connected upon the second-conductive type GaN nanorod of the nanorod array for applying voltage thereto.

2. An LED according to claim 1, wherein a transparent insulating material is filled among the plurality of nanorods.

3. An LED according to claim 2, wherein the transparent insulating material is SOG (Spin-On-Glass), $SiO_2$ or an epoxy resin.

4. An LED according to claim 2, wherein a fluorescent material is added to the transparent insulating material so that a light emitted from the LED becomes a white light as a whole.

5. An LED according to claim 2, wherein the transparent insulating material is filled among the plurality of nanorods in a height lower than the nanorods so that top ends of the nanorods are exposed to a predetermined extent.

6. An LED according to claim 1, wherein a content of In is differently controlled in each of the plurality of InGaN layers in the multi quantum well so that a light emitted from the LED becomes a white light as a whole.

7. An LED according to claim 1, wherein the substrate is a sapphire substrate, wherein a first-conductive type GaN buffer layer is interposed between the sapphire substrate and the nanorods, and wherein the electrode pad is formed on a part of the GaN buffer layer.

8. An LED according to claim 1, wherein the substrate is a silicon substrate, wherein the electrode pad is formed on a surface of the silicon substrate opposed to a surface formed by the nanorods.

9. A GaN nanorod in which a first-conductive type GaN nanorod, an InGaN quantum well and a second-conductive type GaN nanorod are subsequently formed in a longitudinal direction thereof, the quantum well being a multi quantum well in which a plurality of InGaN layers and a plurality of GaN barrier layers are formed in turns.

10. A GaN light emitting diode (LED) comprising:
GaN nanorods in which a first-conductive type CaN nanorod, an InGaN quantum well and a second-conductive type CaN nanorod are subsequently formed in a longitudinal direction thereof, the quantum well being a multi quantum well in which a plurality of InGaN layers and a plurality of GaN barrier layers are formed in turns; and
electrodes for supplying voltage to both ends of the GaN nanorod respectively.

* * * * *